(12) United States Patent
Huang et al.

(10) Patent No.: US 12,046,596 B2
(45) Date of Patent: Jul. 23, 2024

(54) SEMICONDUCTOR STRUCTURE AND FORMING METHOD THEREOF

(71) Applicant: UNITED MICROELECTRONICS CORP., Hsin-Chu (TW)

(72) Inventors: Wei-Lun Huang, Tainan (TW); Chia-Ling Wang, Yunlin County (TW); Chia-Wen Lu, Chiayi County (TW); Ping-Hung Chiang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 429 days.

(21) Appl. No.: 17/495,783

(22) Filed: Oct. 6, 2021

(65) Prior Publication Data

US 2023/0080968 A1  Mar. 16, 2023

(30) Foreign Application Priority Data

Sep. 10, 2021  (TW) .................. 110133685

(51) Int. Cl.
*H01L 27/088* (2006.01)
*H01L 21/8234* (2006.01)
*H01L 29/06* (2006.01)

(52) U.S. Cl.
CPC .. *H01L 27/0883* (2013.01); *H01L 21/823462* (2013.01); *H01L 29/0649* (2013.01)

(58) Field of Classification Search
CPC ............... H01L 27/088; H01L 27/0883; H01L 21/823462; H01L 29/0649; H01L 21/76229; H01L 27/14638; H01L 27/1463; H01L 27/14605; H01L 27/14689; H01L 27/14643; H01L 27/14612; H01L 27/1461; H01L 21/02238; H01L 21/02164; H01L 21/76237; H01L 21/02126; H01L 21/76232; H10B 99/00; H10B 12/053; H10B 12/09; H10B 12/30; H10B 61/20; H10B 63/30; H04N 25/77
See application file for complete search history.

(56) References Cited

U.S. PATENT DOCUMENTS

| | | | | |
|---|---|---|---|---|
| 9,825,146 | B2* | 11/2017 | Lim | H10B 12/482 |
| 10,411,088 | B2 | 9/2019 | Hsiung | |
| 2007/0210403 | A1* | 9/2007 | Sandhu | H10B 41/42 |
| | | | | 257/E27.081 |
| 2011/0057287 | A1* | 3/2011 | Mitsuhira | H10B 41/40 |
| | | | | 257/E23.005 |
| 2012/0074498 | A1* | 3/2012 | Chuang | H01L 29/78 |
| | | | | 257/E21.546 |
| 2013/0062682 | A1* | 3/2013 | Endo | H10B 41/35 |
| | | | | 257/E21.54 |

(Continued)

*Primary Examiner* — Mouloucoulaye Inoussa
(74) *Attorney, Agent, or Firm* — Winston Hsu

(57) ABSTRACT

The invention provides a method for forming a semiconductor structure, which comprises providing a substrate, sequentially a first groove and a second groove are formed in the substrate, the depth of the first groove is different from the depth of the second groove, a first oxide layer is formed in the first groove, a second oxide layer is formed in the second groove, an etching step is performed to remove part of the first oxide layer, a first gate structure is formed on the first oxide layer, and a second gate structure is formed on the second oxide layer.

14 Claims, 5 Drawing Sheets

(56) References Cited

U.S. PATENT DOCUMENTS

2013/0241027 A1\* 9/2013 Kwak ............. H01L 21/823431
　　　　　　　　　　　　　　　　　　　　　　　257/506
2020/0203215 A1\* 6/2020 Jang ....................... H10B 99/00
2020/0381292 A1\* 12/2020 Kim ................... H01L 21/02238
2021/0126098 A1\* 4/2021 Lee ....................... H10B 12/34

\* cited by examiner

SEMICONDUCTOR STRUCTURE AND FORMING METHOD THEREOF

BACKGROUND OF THE INVENTION

1. Field of the Invention

The present invention relates to the field of semiconductors, in particular to a method for manufacturing high voltage transistors with oxide layers with different thicknesses on the same substrate.

2. Description of the Prior Art

Embedded High Voltage (eHV) technology is based on logic CMOS technology, which is used to manufacture various display driver ICs, and plays a key role in various display panels including LCD, organic light emitting diode (OLED) and emerging micro-LED, micro-OLED, etc.

In the current mainstream thin film transistor (TFT) technology, the greatest advantage of TFT made of low temperature polysilicon (LTPS) is its ultra-high mobility, it can reduce the driving voltage, and the response speed is very fast. Besides, it only needs a small space, which is most suitable for screens with high rearrangement rate.

TFTs made with LTPS mentioned above have very good mobility performance, but they are also very expensive. The cost will be quite high if the producer wants to make a large screen. Therefore, the industry has chosen LTPO (Low Temperature Polycrystalline Oxide) technology by combining LTPS with IGZO. Thin film transistors made of LTPO have the advantages of LTPS and thin film transistors made of oxide, including high mobility, low leakage current, etc.

SUMMARY OF THE INVENTION

The invention provides a method for forming a semiconductor structure, which comprises providing a substrate, sequentially a first groove and a second groove are formed in the substrate, the depth of the first groove is different from the depth of the second groove, a first oxide layer is formed in the first groove, a second oxide layer is formed in the second groove, an etching step is performed to remove part of the first oxide layer, a first gate structure is formed on the first oxide layer, and a second gate structure is formed on the second oxide layer.

The invention also provides a semiconductor structure, which comprises a substrate, a first oxide layer and a second oxide layer in the substrate, wherein the first oxide layer and the second oxide layer have different thicknesses, and a first gate structure on the first oxide layer and a second gate structure on the second oxide layer.

The method is characterized in that grooves with different depths are formed on the same substrate, and then the grooves with different depths are respectively made into oxide layers of high voltage transistors. In other words, high voltage transistors with oxide layers of different thicknesses can be formed on the same substrate. According to the invention, the thickness of the oxide layer can be adjusted according to the operating voltage of each high voltage transistor, so that the problem of performance reduction caused by mismatch between the operating voltage and the thickness of the oxide layer can be avoided. In addition, many different high voltage transistors are fabricated on the same substrate at the same time, which can also increase the flexibility of the manufacturing process. Moreover, the method provided by the invention is compatible with the existing manufacturing process and does not need to spend a lot of extra cost.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
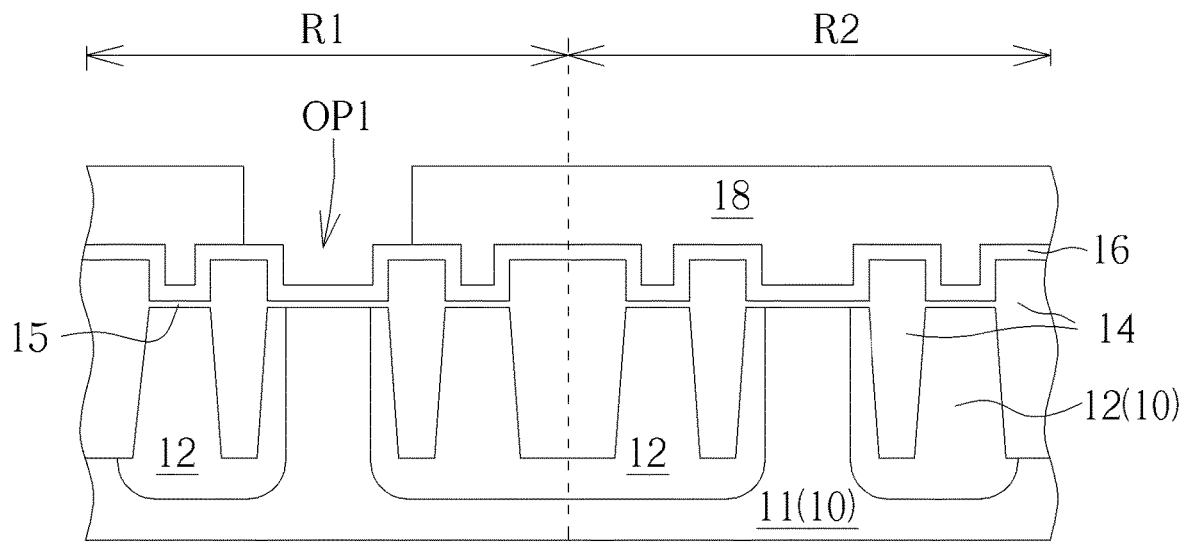
FIG. 1 to FIG. 10 are schematic cross-sectional views of a process for fabricating a semiconductor structure according to a preferred embodiment of the present invention.

FIG. 1 to FIG. 10 are schematic cross-sectional views of a process for fabricating a semiconductor structure according to a preferred embodiment of the present invention. As shown in FIG. 1, first, a substrate 10, such as a silicon substrate, is provided for carrying other devices. In addition, a first region R1 and a second region R2 are defined on the substrate 10, in which different transistors will be formed in the first region R1 and the second region R2 in subsequent steps. For example, transistors with different oxide thicknesses can be formed in the two regions respectively, especially when these transistors are applied with larger and different voltages (i.e., these transistors are high-voltage devices), in order to prevent the current passing through the transistors from being affected, different transistors need to have oxide layers matching the voltage. One of the purposes of this embodiment is to fabricate transistors with different oxide thicknesses on the same substrate, so as to allow different voltages to be applied to different transistors, thereby increasing the application range of products.

Then, a well region 11 and a doped region 12 are formed in the substrate 10 by doping. The well region 11 and the doped region 12 have different doping concentrations, and the doped region 12 can be used as a source/drain region of a transistor which is formed in the subsequent steps. Then, a plurality of shallow trench isolations 14 are formed in the doped regions 12. The material of the shallow trench isolations 14 is, for example, silicon oxide. One part of the shallow trench isolations 14 is located in the doped regions 12 of the substrate 10 (i.e., into the substrate 10), and the other part protrudes from the surface of the substrate 10. In addition, in the process of forming the shallow trench isolation 14, a thin oxide layer 15 may be formed on the surface of the substrate 10 between the shallow trench isolation 14. In addition, a mask layer 16 is formed to cover the substrate 10 and each shallow trench isolation 14. The material of the mask layer 16 is, but not limited to, silicon nitride.

Then, in order to form transistors with different oxide thicknesses in the first region R1 and the second region R2, it is necessary to form grooves with different depths in the first region R1 and the second region R2, respectively, to accommodate the subsequently formed gate oxide layer. As shown in FIG. 1, a patterned photoresist layer 18 is formed over the mask layer 16, the patterned photoresist layer 18 includes an opening OP1 exposing a part of the region where the gate structure of the transistor is to be formed later. For example, the region disposed just above the well region 11 between two doped regions 12 in the first region R1.

Figure 2:
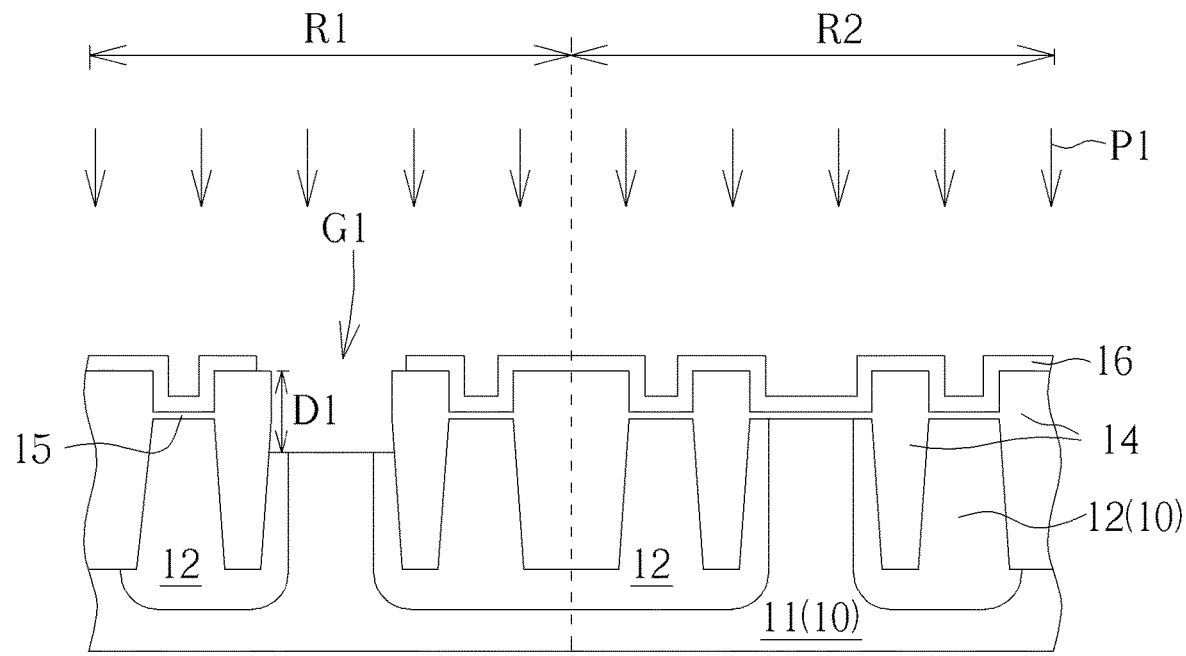

Then, as shown in FIG. 2, an etching step P1 is performed to remove part of the mask layer 16 and the underlying substrate (including part of the well region 11 and part of the doped region 12) using the patterned photoresist layer 18 as a mask, so as to form a first groove G1 in the first region R1. In this embodiment, the first groove G1 has a first depth D1. Thereafter, the patterned photoresist layer 18 is removed.

Figure 3:
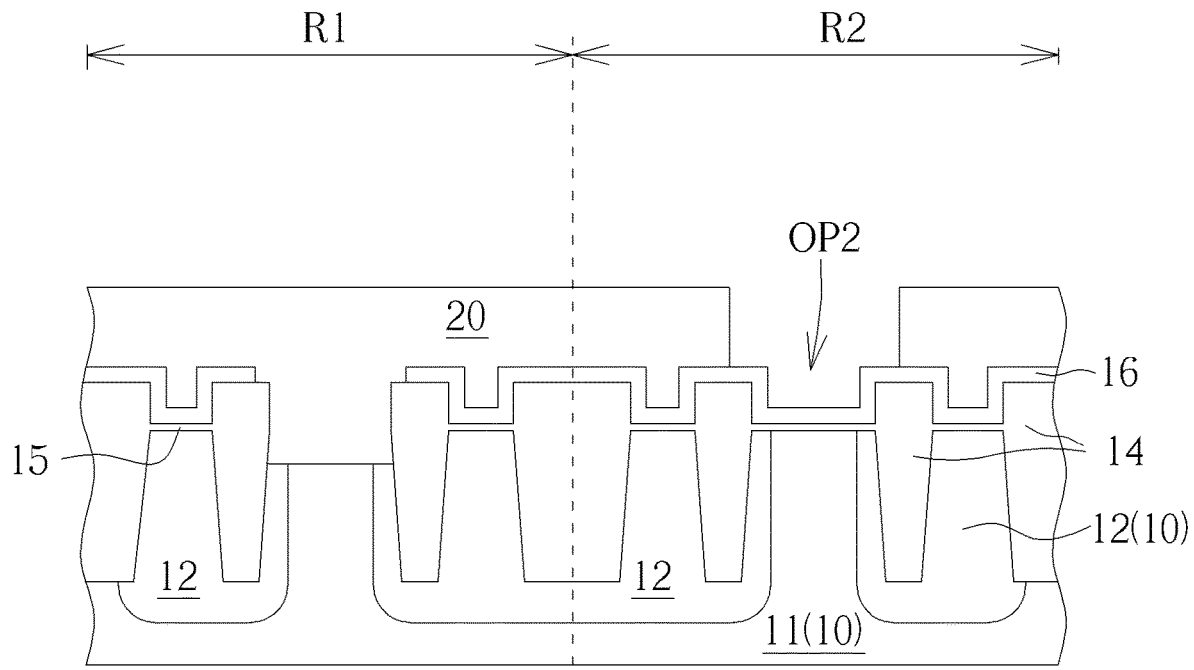

Then repeat the steps similar to those described in FIG. 1-2 above. First, as shown in FIG. 3, another patterned photoresist layer 20 is formed, the patterned photoresist layer 20 includes an opening OP2 formed in the second region R2, and the opening OP12 exposes a part of the region where the gate structure of the transistor is to be formed later, for example, the region disposed just above the well region 11 between two doped regions 12 in the second region R2.

Figure 4:
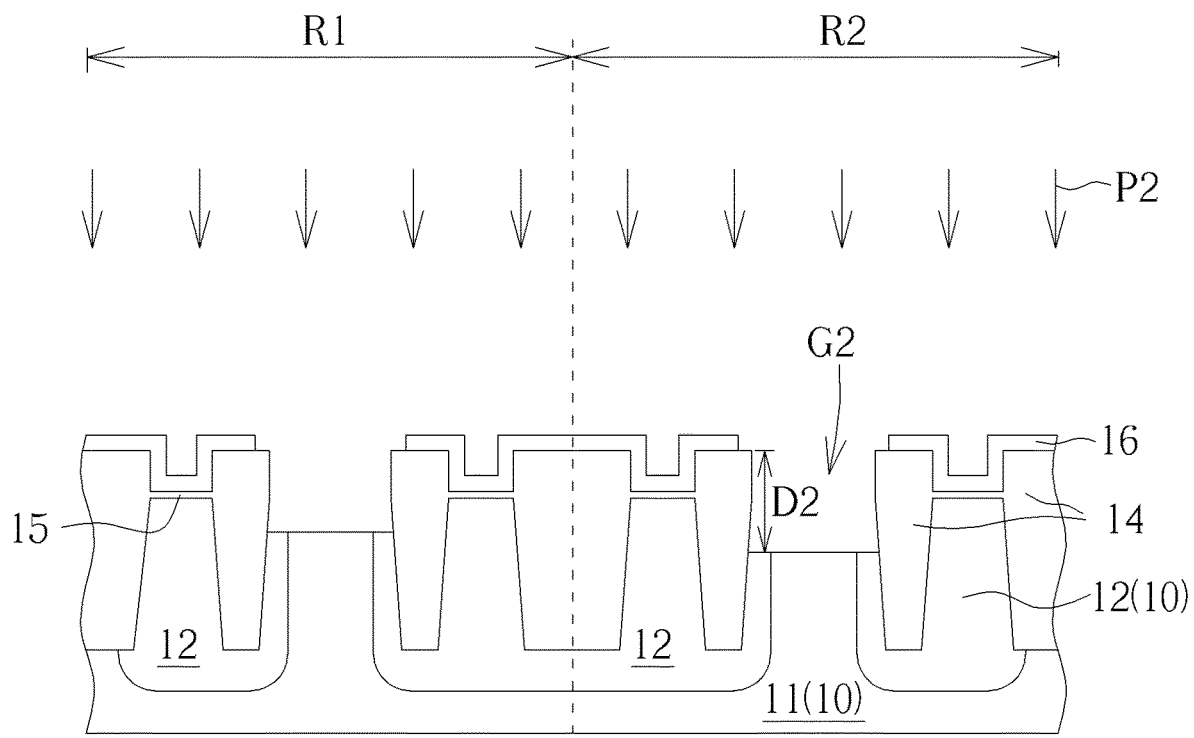

As shown in FIG. 4, an etching step P2 is performed, and using the patterned photoresist layer 20 as a mask to remove part of the mask layer 16 and the underlying substrate (including part of the well region 11 and part of the doped region 12), so as to form a second groove G2 in the second region R2. The second groove G2 has a second depth D2 which is different from the first depth D1. For example, in this embodiment, the second depth D2 is greater than the first depth D1. Thereafter, the patterned photoresist layer 20 is removed.

Figure 5:
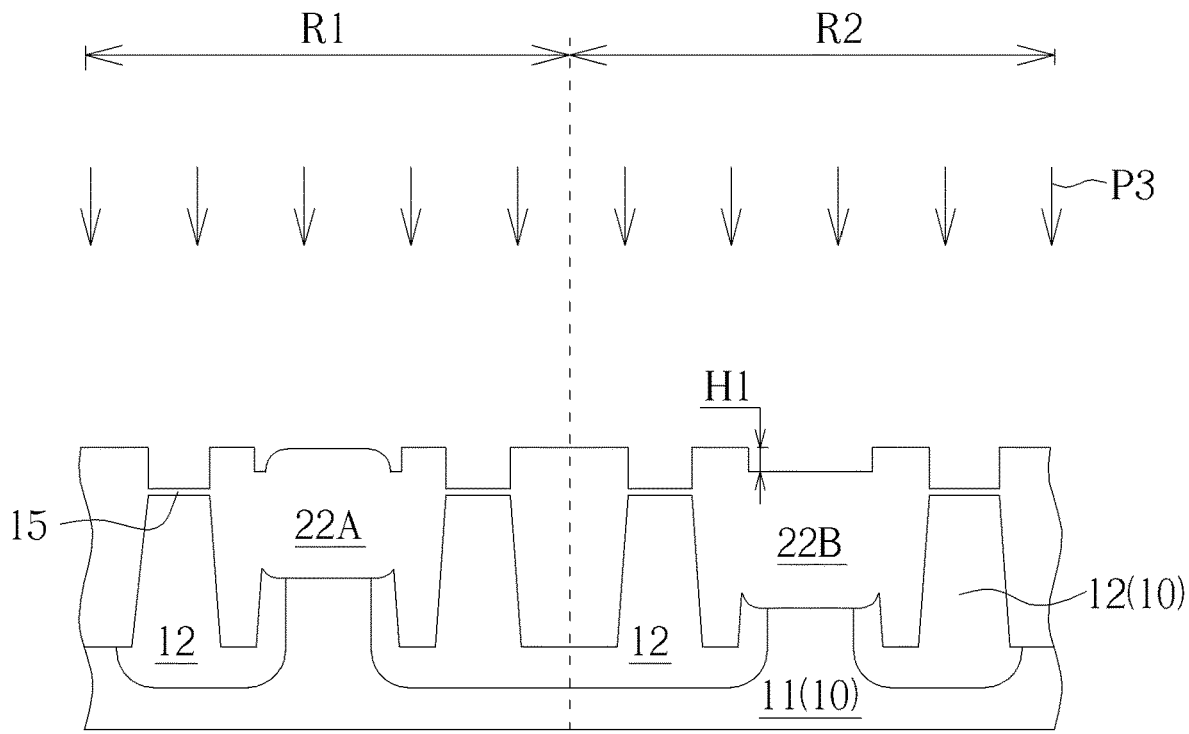

As shown in FIG. 5, after removing the patterned photoresist layer 20, an oxidation step P3 is performed to form an oxide layer 22A and an oxide layer 22B in the first groove G1 and the second groove G2 respectively. Since the oxidation rates are nearly equal in the two grooves, and the second groove G2 is deeper than the first groove G1, so the top surface height of the oxide layer 22B in the second groove G2 is lower than that of the oxide layer 22A in the first groove G1 after the oxide layers 22A and the oxide layer 22B are completed. Thereafter, the mask layer 16 is removed to expose the thin oxide layer 15 on the surface of the substrate 10. In addition, after this step, another oxidation step (not shown) can be used to increase the thickness of the thin oxide layer 15, or another oxide layer can be re-formed after removing the thin oxide layer 15, which can be used as the gate dielectric layer of other gate devices (not for the high voltage transistors).

Figure 6:
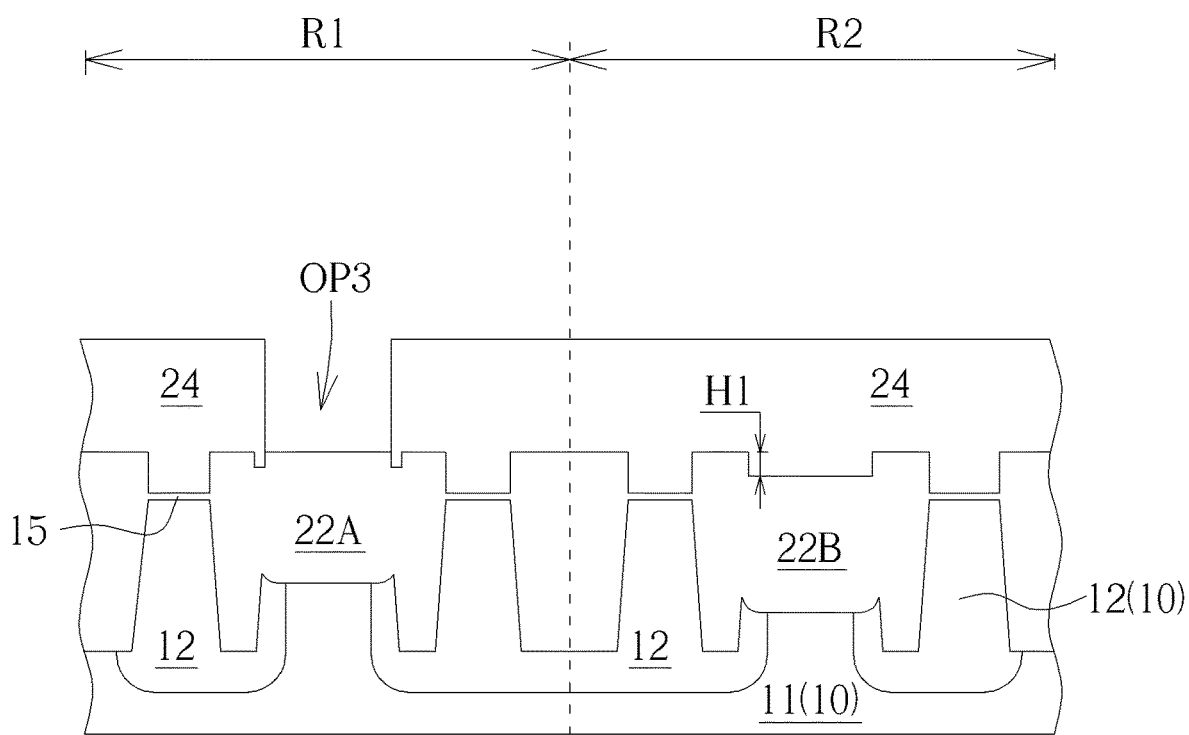

At this time, the oxide layer 22A in the first groove G1 is higher than the oxide layer 22B in the second groove G2, that is, there is a height difference H1 between them. To eliminate this height difference, as shown in FIG. 6, another patterned photoresist layer 24 is formed to cover the substrate 10, and the patterned photoresist layer 24 has an opening OP3 exposing the oxide layer 22A in the first groove G1. In addition, the width of the opening OP3 here can also be same as the width of the gate structure which is formed in later steps, so as to save the number of masks.

Figure 7:
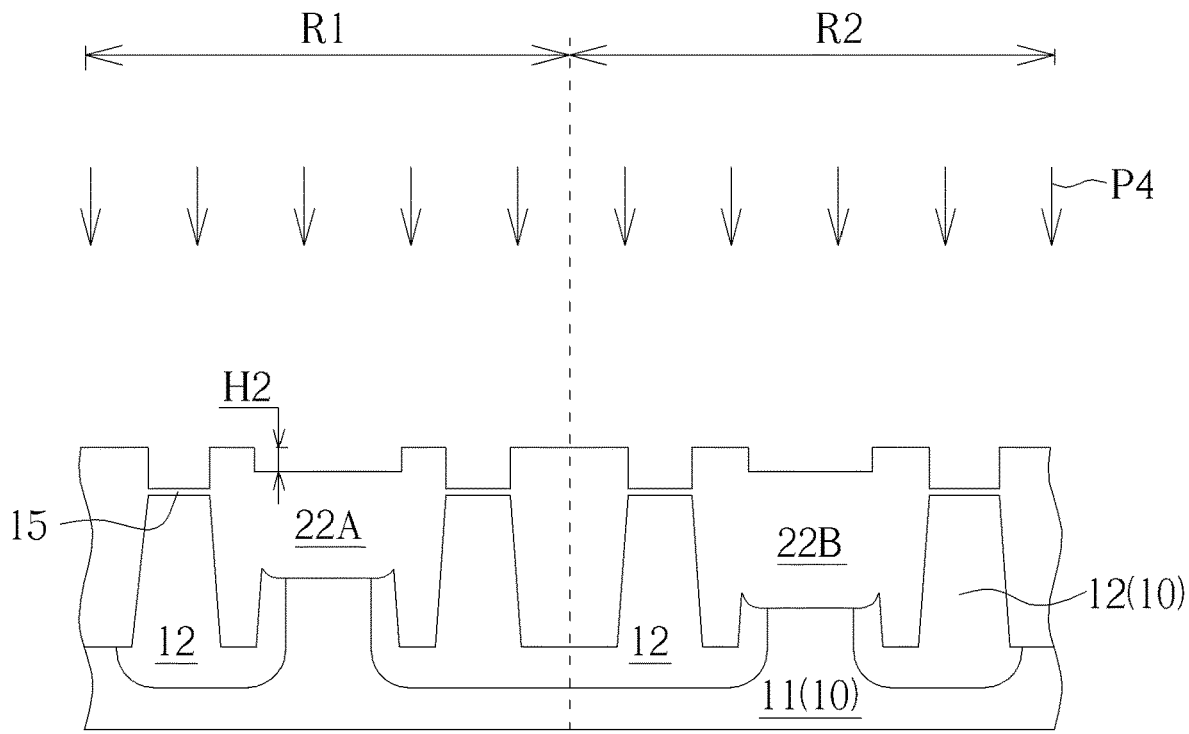

Then, as shown in FIG. 7, an etching-back step P4 is performed to remove part of the oxide layer 22A. In this step, the etching parameters can be controlled to adjust the top surfaces of the oxide layers 22A and 22B in the first groove G1 and the second groove G2 to be nearly horizontally aligned with each other. That is, the original height difference H1 between the oxide layers 22A and 22B has been nearly eliminated. However, it should be noted that after the etching-back step P4, the top surface of the shallow trench isolation 14 and the top surface of the oxide layer 22A or 22B still have a height difference H2, which will affect the formation of the subsequent gate structure.

Figure 8:
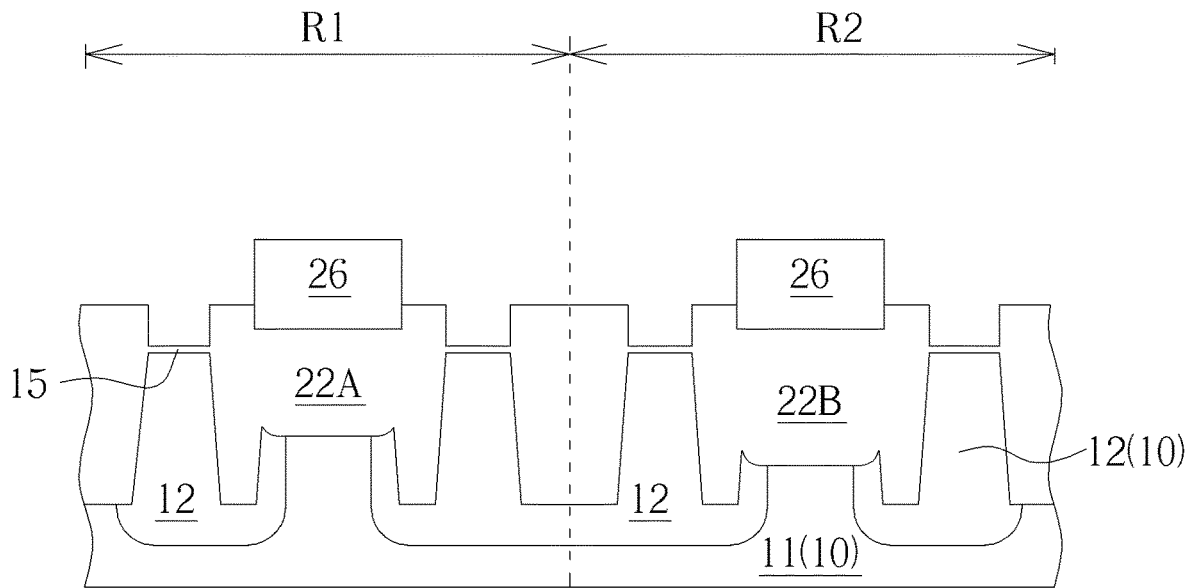
Figure 9:
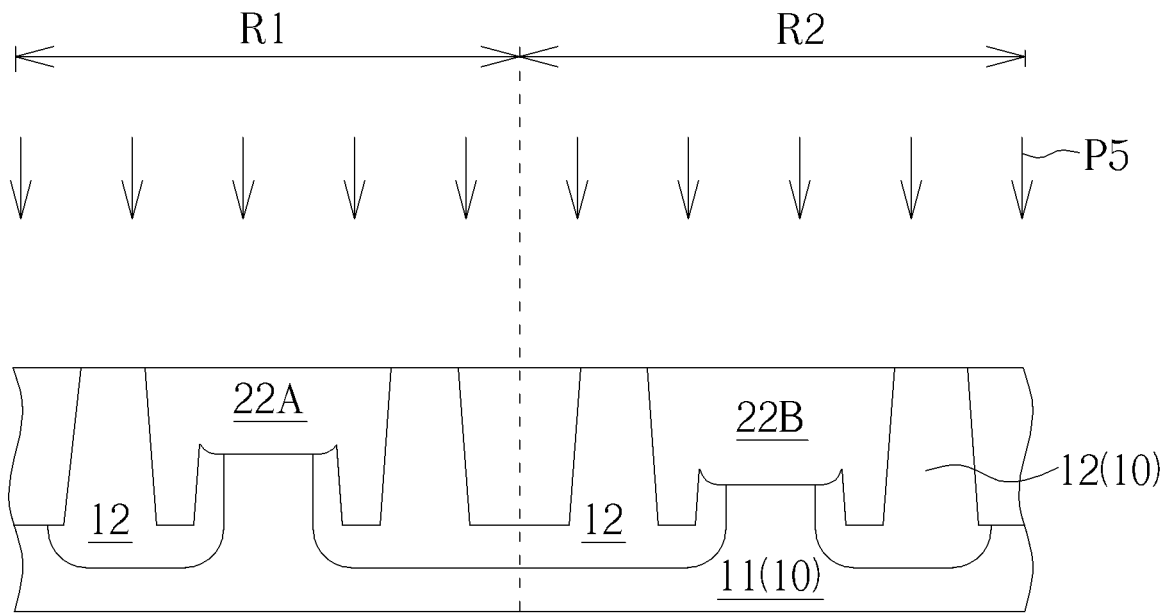

Next, in order to eliminate the height difference H2, as shown in FIG. 8, another patterned photoresist layer 26 is formed to cover the regions on the oxide layers 22A and 22B. Here, the patterned photoresist layer 26 can correspond to the positions of the oxide layers 22A and 22B, and the shallow trench isolation 14 is not covered by the patterned photoresist layer 26, so as to protect the oxide layers 22A and 22B from being damaged in the next etching step. In addition, the patterned photoresist layer 26 here can also correspond to the patterns of other gate structures (such as non-high voltage gate structures located in other regions). That is to say, except for eliminating the height difference H2, the positions of the gate structures in other regions can also be defined. Then, as shown in FIG. 9, the thin oxide layer 15 uncovered by the patterned photoresist layer 26 and part of the shallow trench isolation 14 are removed by an etching-back step P5. After the etching-back step P5, the top surfaces of the oxide layers 22A and 22B are flush with the top surface of the substrate 10.

In the steps shown in FIG. 6 to FIG. 9 above, using the patterned photoresist layer as a protective layer, the protruding portion of the oxide layer 22A and part of the shallow trench isolation 14 and the thin oxide layer 15 are removed, so that the top surfaces of the oxide layers 22A and 22B are flush with the substrate 10. It is worth noting that if the oxide layer 22A is removed by planarization (e.g., chemical mechanical polishing), since the distribution density of the oxide layer 22A on the surface of the substrate 10 is different from that of other surrounding oxide layers, it is easy to produce a loading effect that affects the planarization result. Therefore, compared with the planarization step, the steps shown in FIG. 6 to FIG. 9 can more accurately remove part of the oxide layer 22A, so that the top surfaces of the substrate 10 and the oxide layers 22A and 22B are flatter, which is beneficial to the subsequent formation of the gate structure.

Figure 10:
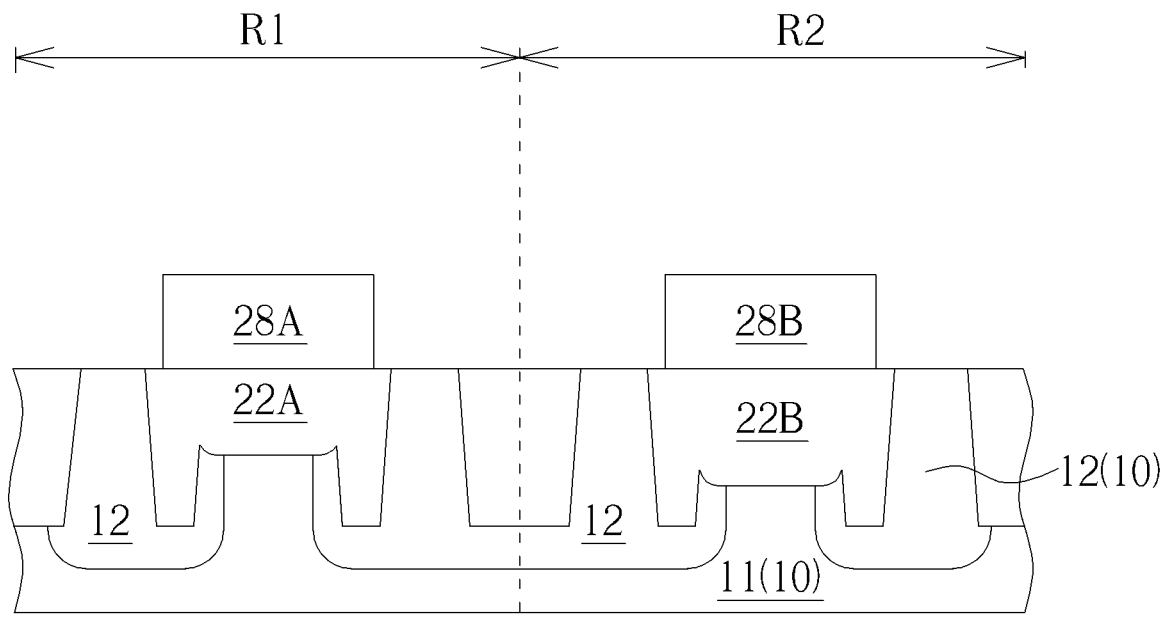

As shown in FIG. 10, gate structures 28A and 28B are respectively formed on the oxide layer 22A and the oxide layer 22B. The gate structures 28A and 28B are, for example, polysilicon gates, which are used as the gates of a high voltage transistor. In addition, gate structures 28A and 28B are located directly above the oxide layer 22A and the oxide layer 22B respectively. Other devices (e.g., contact structures to connect with gate structures) may be formed later, and the formation methods of these devices belong to the conventional technology in the field, so they will not be described in detail here.

The invention is characterized in that grooves with different depths are formed on the same substrate, and then oxidation steps are carried out in the grooves to form oxide layers 22A and 22B with different thicknesses as oxide layers of different high voltage transistors. According to the method provided by the invention, high voltage transistors with different oxide layer thicknesses can be formed on the same substrate, so that the method can be applied to various products. For example, the operating voltage of thin film transistors made of low temperature polysilicon (LTPS) is about 20V, while the operating voltage of thin film transistors made of low temperature polysilicon oxide (LTPO) is about 27V, and the two transistors have suitable oxide layer thicknesses. The present invention provides a method for fabricating two transistors with different operating voltages on the same substrate, so that the flexibility of the manufacturing process can be improved, for example, more diversified circuit structures can be combined.

In addition, the method provided by the invention can be compatible with the existing process, and transistors with different thicknesses of oxide layers can be manufactured without spending a lot of cost. In addition, if the steps of the invention are repeated many times, more kinds of oxide layers with different thicknesses can be produced. This feature is also within the scope of the present invention.

According to the above description and drawings, the present invention provides a method for forming a semiconductor structure, which comprises providing a substrate 10, sequentially forming a first groove G1 and a second groove G2 in the substrate 10, the depth D1 of the first groove G1 is different from the depth D2 of the second groove G2, a first oxide layer 22A is formed in the first groove G1 and a second oxide layer 22B is formed in the second groove G2, and an etching step P4 is performed to remove part of the first oxide layer 22A, and a first gate structure 28A is formed on the first oxide layer 22A and a second gate structure 28B is formed on the second oxide layer 22B.

In some embodiments of the present invention, when the first oxide layer 22A and the second oxide layer 22B are formed, the height of the first oxide layer 22A is different from that of the second oxide layer 22B.

In some embodiments of the present invention, the first oxide layer 22A and the second oxide layer 22B are simultaneously formed in the first groove G1 and the second groove G2 respectively by an oxidation step P3.

In some embodiments of the present invention, after the etching-back step P4 is performed, the top surfaces of the first oxide layer 22A and the second oxide layer 22B have the same height.

In some embodiments of the present invention, the first oxide layer 22A and the first gate junction 28A constitute a first high voltage transistor, and the second oxide layer 22B and the second gate structure 28B constitute a second high voltage transistor, different voltages are applied to the first high voltage transistor and the second high voltage transistor.

In some embodiments of the present invention, the first oxide layer 22A is the gate oxide layer in the first high voltage transistor, and the second oxide layer 22B is the gate oxide layer in the second high voltage transistor.

In some embodiments of the present invention, the etching-back step P4 includes multiple etch-back steps, and one of the etch-back steps includes forming a patterned photoresist layer 24 covering the substrate 10, the patterned photoresist layer 24 including an opening OP3 exposing part of the first oxide layer 22A, and removing part of the first oxide layer 22A and reducing the height of the first oxide layer 22A by an etching-back step P4.

In some embodiments of the present invention, the width of the opening OP3 of the patterned photoresist layer 24 is the same as the width of the first gate structure 28A.

Some embodiments of the present invention further include forming a plurality of shallow trench isolations 14 in the substrate 10, the first oxide layer is located between two shallow trench isolations and connected with two adjacent shallow trench isolations.

In some embodiments of the present invention, the depth of the shallow trench isolation 14 is greater than the depth of the first oxide layer 22A.

The invention provides a semiconductor structure, which comprises a substrate 10, a first oxide layer 22A and a second oxide layer 22B in the substrate 10, wherein the first oxide layer 22A and the second oxide layer 22B have different thicknesses, and a first gate structure 28A on the first oxide layer 22A and a second gate structure 28B on the second oxide layer 22B.

In some embodiments of the present invention, the first oxide layer 22A and the second oxide layer 22B are not connected with each other.

Some embodiments of the present invention further include a plurality of shallow trench isolations 14 located in the substrate 10, the first oxide layer 22A is located between two shallow trench isolations 14 and connected with two adjacent shallow trench isolations 14.

In some embodiments of the present invention, the depth of the shallow trench isolation 14 is greater than the depth of the first oxide layer 22A.

In some embodiments of the present invention, the top surface of the first oxide layer 22A is flush with the top surface of the second oxide layer 22B, but the bottom surface of the first oxide layer 22A and the bottom surface of the second oxide layer 22B are located at different levels.

In some embodiments of the present invention, the first oxide layer 22A and the first gate structure 28A constitute a first high voltage transistor, and the second oxide layer 22B and the second gate structure 28B constitute a second high voltage transistor.

To sum up, the invention is characterized in that grooves with different depths are formed on the same substrate, and then the grooves with different depths are respectively made into oxide layers of high voltage transistors. In other words, high voltage transistors with oxide layers of different thicknesses can be formed on the same substrate. According to the invention, the thickness of the oxide layer can be adjusted according to the operating voltage of each high voltage transistor, so that the problem of performance reduction caused by mismatch between the operating voltage and the thickness of the oxide layer can be avoided. In addition, many different high voltage transistors are fabricated on the same substrate at the same time, which can also increase the flexibility of the manufacturing process. Moreover, the method provided by the invention is compatible with the existing manufacturing process and does not need to spend a lot of extra cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for forming a semiconductor structure, comprising:
   providing a substrate;
   forming a plurality of shallow trench isolations in the substrate;
   forming a first groove and a second groove in the substrate, wherein the depth of the first groove is different from the depth of the second groove;

forming a first oxide layer in the first groove and a second oxide layer in the second groove, wherein the first oxide layer is located between two of the shallow trench isolations, and the first oxide layer contacts the two shallow trench isolations directly when viewed from a cross section view;

performing an etching step to remove part of the first oxide layer; and forming a first gate structure on the first oxide layer, and forming a second gate structure on the second oxide layer.

2. The method according to claim 1, wherein when the first oxide layer and the second oxide layer are formed, the heights of the first oxide layer and the second oxide layer are different.

3. The method according to claim 1, wherein the first oxide layer and the second oxide layer are simultaneously formed in the first groove and the second groove respectively by an oxidation step.

4. The method according to claim 1, wherein after the etching step, a top surfaces of the first oxide layer and a top surface of the second oxide layer are on a same level.

5. The method according to claim 1, wherein the first oxide layer and the first gate structure constitute a first high voltage transistor, and the second oxide layer and the second gate structure constitute a second high voltage transistor, wherein different voltages are applied to the first high voltage transistor and the second high voltage transistor.

6. The method according to claim 5, wherein the first oxide layer is a gate oxide layer in the first high voltage transistor, and the second oxide layer is a gate oxide layer in the second high voltage transistor.

7. The method according to claim 1, wherein the etching step comprises multiple etching-back steps, and one of the multiple etching-back steps comprises:

forming a patterned photoresist layer covering the substrate, wherein the patterned photoresist layer comprises an opening exposing part of the first oxide layer; and performing an etching-back to remove part of the first oxide layer and reduce the height of the first oxide layer.

8. The method according to claim 7, wherein a width of the opening of the patterned photoresist layer is the same as a width of the first gate structure.

9. The method according to claim 1, wherein a depth of the shallow trench isolation is greater than a depth of the first oxide layer.

10. A semiconductor structure comprising:
a substrate;
a plurality of shallow trench isolations in the substrate;
a first oxide layer and a second oxide layer located in the substrate, wherein the first oxide layer and the second oxide layer have different thicknesses, and wherein the first oxide layer is located between two of the shallow trench isolations, and the first oxide layer contacts the two shallow trench isolations directly when viewed from a cross section view; and
a first gate structure on the first oxide layer and a second gate structure on the second oxide layer.

11. The semiconductor structure according to claim 10, wherein the first oxide layer and the second oxide layer are not connected with each other.

12. The semiconductor structure of claim 10, wherein a depth of the shallow trench isolation is greater than a depth of the first oxide layer.

13. The semiconductor structure according to claim 10, wherein a top surface of the first oxide layer and a top surface of the second oxide layer are disposed on a same level, but a bottom surface of the first oxide layer and a bottom surface of the second oxide layer are disposed on different levels.

14. The semiconductor structure according to claim 10, wherein the first oxide layer and the first gate structure constitute a first high voltage transistor, and the second oxide layer and the second gate structure constitute a second high voltage transistor.

* * * * *